United States Patent
Wang et al.

(10) Patent No.: US 8,053,796 B2
(45) Date of Patent: Nov. 8, 2011

(54) SOLID STATE LIGHT EMITTING DEVICE

(75) Inventors: Chun-Wei Wang, Miao-Li Hsien (TW);
Hung-Kuang Hsu, Miao-Li Hsien (TW);
Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 11/964,845

(22) Filed: Dec. 27, 2007

(65) Prior Publication Data

US 2009/0090926 A1     Apr. 9, 2009

(30) Foreign Application Priority Data

Oct. 9, 2007    (CN) .......................... 2007 1 0201967

(51) Int. Cl.
*H01L 33/00* (2010.01)
(52) U.S. Cl. .............. 257/98; 257/99; 257/100; 257/79; 257/701; 257/787; 257/774; 257/700; 257/758; 257/680
(58) Field of Classification Search .................. 257/98, 257/99, 79, 701, 787, 774, 784, 700, 758, 257/680
See application file for complete search history.

(56) References Cited

U.S. PATENT DOCUMENTS

| | | | |
|---|---|---|---|
| 3,840,769 A * | 10/1974 | Yamamoto et al. | 313/500 |
| 5,914,501 A | 6/1999 | Antle et al. | |
| 5,962,950 A * | 10/1999 | Egara et al. | 310/313 R |
| 6,670,751 B2 | 12/2003 | Song et al. | |
| 6,894,315 B2 | 5/2005 | Chung et al. | |
| 6,936,862 B1 | 8/2005 | Chang et al. | |
| 7,025,651 B2 | 4/2006 | Song et al. | |
| 7,252,408 B2 * | 8/2007 | Mazzochette et al. | 362/294 |
| 7,365,371 B2 * | 4/2008 | Andrews | 257/99 |
| 2007/0018191 A1 | 1/2007 | Roh et al. | |

FOREIGN PATENT DOCUMENTS

| | | |
|---|---|---|
| CN | 2722440 Y | 8/2005 |
| CN | 1702862 A | 11/2005 |
| CN | 1801497 A | 7/2006 |
| CN | 1905223 A | 1/2007 |
| JP | 2005-39177 A | 2/2005 |

OTHER PUBLICATIONS

Rong-Ting Huang et al., Design and fabrication of AlGaInP LED array with integrated GaAs decode circuits, IEEE Transactions on Electron Devices,vol. 45, No. 11, Nov. 1998.

* cited by examiner

*Primary Examiner* — Samuel Gebremariam
(74) *Attorney, Agent, or Firm* — Altis Law Group, Inc.

(57) ABSTRACT

A solid state light emitting device includes a laminated substrate structure (120), an LED chip (30), a transparent capsulation material (50) and an electric component (40). The laminated substrate structure includes a first substrate (10) and a second substrate (20) attached to each other by a sintering process. The first substrate has a mounting surface (100) and a receiving through hole (11) defined in the mounting surface thereof. The LED chip is mounted on the mounting surface of the first substrate. The transparent capsulation material envelops the LED chip therein. The electric component is received in the receiving hole and mounted on the second substrate. The electric component is located below the mounting surface of the first substrate.

16 Claims, 9 Drawing Sheets

SOLID STATE LIGHT EMITTING DEVICE

BACKGROUND

1. Technical Field

The present invention generally relates to solid state light emitting devices and method for manufacturing substrates thereof.

2. Description of Related Art

LEDs (light emitting diodes) each is a type of solid state light emitting device and are widely used in daily life, such as in illumination devices or non-emissive display devices, due to its high brightness, long life-span, and wide color gamut. The researches of LEDs are disclosed in a paper on IEEE Transactions on Electron Devices, entitled "Design and fabrication of AlGaInP LED array with integrated GaAs decode circuits", published by Rong-Ting Huang et al., in 1998, the disclosure of which is incorporated herein by reference.

In ordinary use, an electric component is usually enveloped in the LED for improving the reliability and practicability of the LED. For instance, mounting a zener diode on a surface of a substrate of the LED for increasing electrostatic prevention capability of the LED. The electric component usually is designed to have a black outer surface so as to obtain a good heat dissipation capability. However, the black outer surface would absorb some of light emitted from a LED chip arranged on the surface of the substrate and in juxtaposition with the zener diode, so that the luminous efficiency of the LED is degraded. Thus, there is a need for a LED endowed with additional functions without having to degrade the luminous efficiency.

SUMMARY

The present invention provides a solid state light emitting device endowed with additional functions without having to degrade the luminous efficiency. The solid state light emitting device includes a laminated substrate structure, an LED chip, a transparent capsulation material and an electric component. The laminated substrate structure includes a first substrate and a second substrate attached to each other by a sintering process. The first substrate has a mounting surface and a receiving through hole defined in the mounting surface thereof. The LED chip is mounted on the mounting surface of the first substrate. The transparent capsulation material envelops the LED chip therein. The electric component is received in the receiving hole and mounted on the second substrate. The electric component is located below the mounting surface of the first substrate.

Other advantages and novel features of the present solid state light emitting device will become more apparent from the following detailed description of preferred embodiments when taken in conjunction with the accompanying drawings, in which:

DETAILED DESCRIPTION

Figure 1:
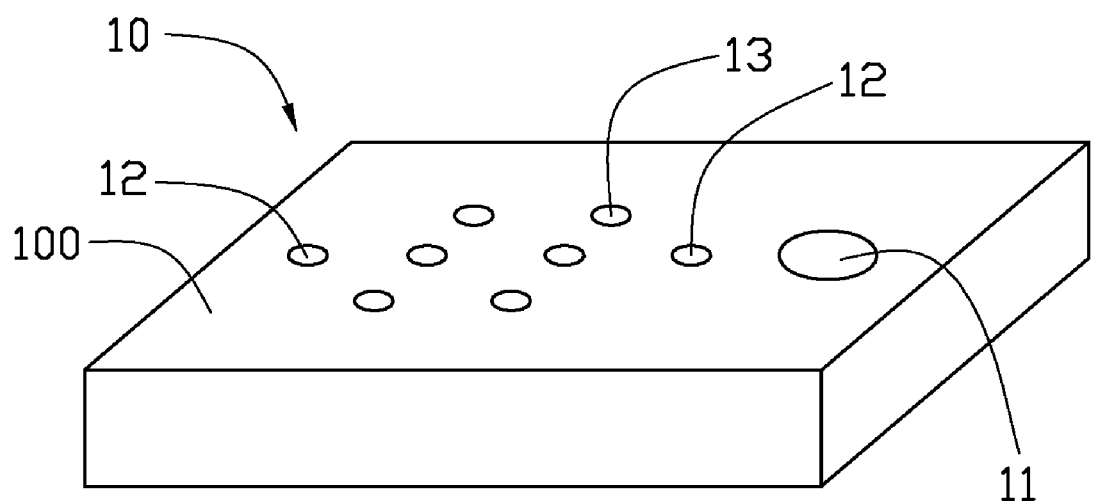
FIG. 1 shows a step in manufacturing a substrate of a LED, in which step a first substrate is provided, and first via holes, first thermo-via holes and a receiving hole are defined in the first substrate.

Reference will now be made to the drawing figures to describe the preferred embodiment in detail.

Figure 3:
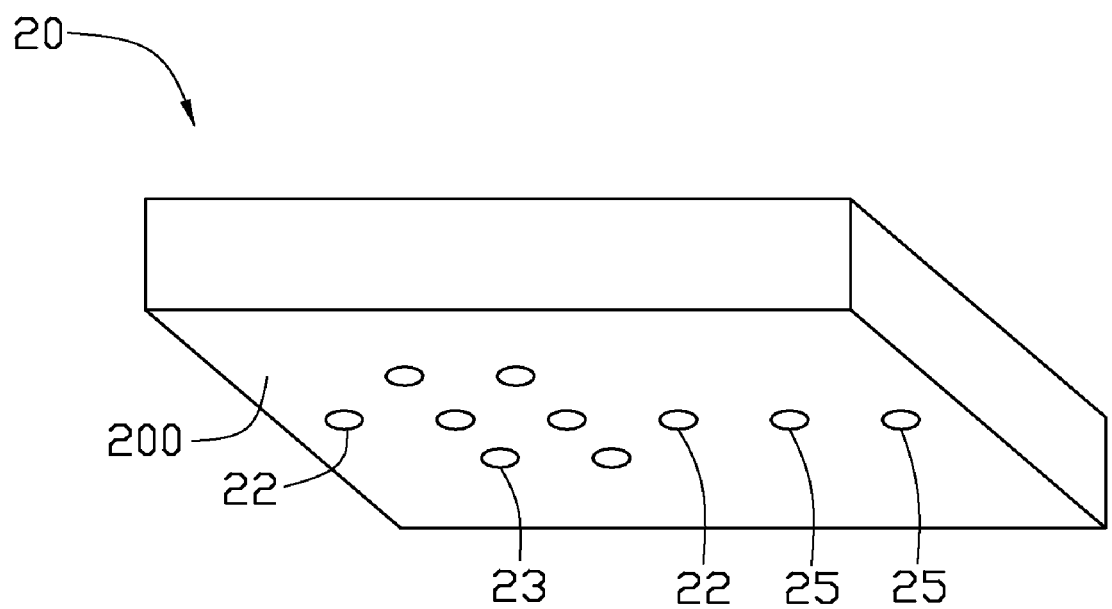
FIG. 3 shows a step in manufacturing the substrate of the LED, in which step a second substrate is provided, and second via holes and second thermo-via holes are defined in the second substrate.
Figure 6:
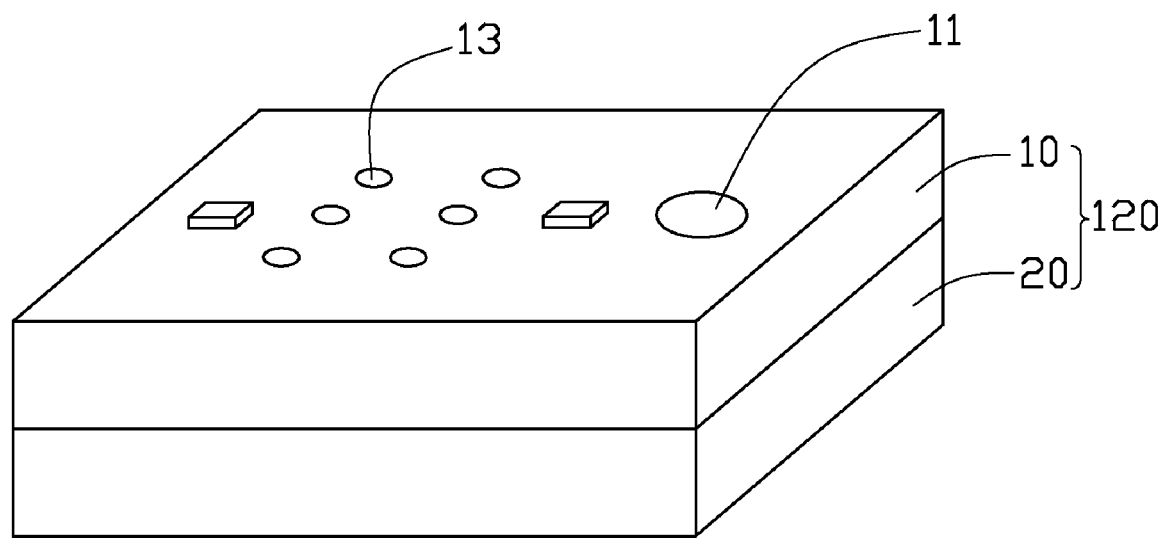
FIG. 6 shows a step in manufacturing the substrate of the LED, in which step the first and second substrates are co-fired together, forming the substrate for the LED.

The present embodiment provides a solid state light emitting device, such as a LED (light emitting diode), which is endowed with additional functions without having to degrade the illumination efficiency. The solid state light emitting device includes a laminated substrate structure 120 which is manufactured by the flowing steps: 1) providing a first substrate 10 which includes a first surface 100 (mounting surface of the first substrate 10), the first surface 100 of the first substrate 10 defining a receiving hole 11 configured for receiving an electric component therein (this step is shown in FIG. 1); 2) providing a second substrate 20 (this step is shown in FIG. 3); 3) stacking the first and the second substrates 10, 20 together; 4) co-sintering the first and the second substrates 10, 20 so that the first substrate 10 is fired into a single piece (this step is shown in FIG. 6). In the hereinabove steps, the steps of providing the first and the second substrates 10, 20 can be regulated, i.e., the step of providing the second substrate 20 can be proceeded before the step of providing the first substrate 10, or the steps of providing the first and the second substrates 10, 20 can be simultaneously executed.

Referring to FIG. 1, the first substrate 10 is rectangular shaped in profile and is made of electric insulating materials such as ceramic material. The main component of the ceramic material is selected from a group consisting of alumina ($Al_2O_3$), magnesia (MgO), aluminum nitride (AlN), boron nitride (BN), silicone dioxide (SiO2) and beryllia (BeO). Alternatively, the first substrate 10 can be made of other electric insulating materials such as glass-fiber.

The first surface 100 is formed on the topmost end of the first substrate 10. The receiving hole 11 is formed at a right side of the first surface 100 and extends through the first substrate 10, accommodating the electric component therein. A height of the receiving hole 11 is 0.1 mm (millimeters) and an area of the receiving hole 11 is more than 0.15 times 0.15 square millimeters ($mm^2$). The electric component can be an integrated circuit for electrostatic protection and an electrostatic prevention element for preventing an LED chip of the LED from electrostatic breakdown. The electrostatic prevention element can be a transistor such as a zener diode, a schottky barrier diode (SBD), or a silicon-based tunneling diode. Alternatively, the electric component can be other elements such as a light intensity sensor connected with a feedback circuit for steadying the light intensity of the LED, or a thermal sensor connected with a cooling system for cooling the LED thereby extending the life-span of the LED.

The first surface 100 further forms two first via holes 12 at a left side and at least a first thermo-via hole 13 between the first via holes 12. The first via holes 12 and the at least a first thermo-via hole 13 extend through the first substrate 10. In FIG. 1, there are six first thermo-via holes 13 formed in the first surface 100. Alternatively, the amount of the first thermo-via holes 13 is not limited to six and the amount of the first via holes 12 is not limited to two. Electrically conductive adhesive or metal such as gold, silver, copper, or etc., is filled in the first via holes 12, for electrically connecting the LED chip with an external power source (not shown). Thermal conductive adhesive or metal such as gold, silver, copper, or etc., is filled in the first thermo-via holes 13 so as to dissipate the heat generated by the LED chip towards outside of the LED. Therefore, the LED chip is cooled during its operation so that the luminous efficiency of the LED is increased and the lifespan of the LED is extended.

Figure 2:
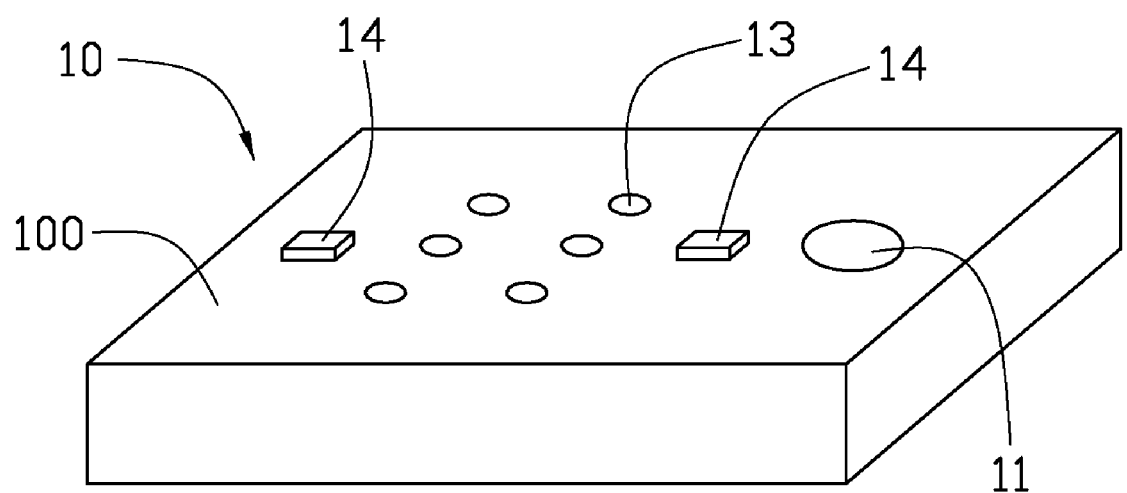
FIG. 2 shows a step in manufacturing the substrate of the LED, in which step electrodes are formed on the first substrate of FIG. 1.

Referring to FIG. 2, two first electrodes 14 are then printed on the first surface 100 of the first substrate 10. The first electrodes 14 entirely cover a topmost end the first via holes 12 so as to provide power to the LED chip.

Referring to FIG. 3, the second substrate 20 is rectangular shaped in profile with the same configuration as the first substrate 10. The second substrate 20 is made of electric insulation materials, such as ceramic or glass fiber, so as to match the materials of the first substrate 10. In this embodiment, the second substrate 20 is, preferably, made of ceramic.

The second surface 200 is formed on the bottommost end of the second substrate 20. The second surface 200 further forms two second via holes 22 and at least a second thermo-via hole 23, which extend through the second substrate 20. In FIG. 3, there are six second thermo-via holes 23 formed in the second surface 200. Alternatively, the amount of the second thermo-via holes 23 is not limited to six the amount of the second via holes 22 is not limited to two. The second via holes 22 and the second thermo-via holes 23 in the second surface 200 of the second substrate 20 respectively correspond to the first via holes 12 and the first thermo-via holes 13 in the first surface 100 of the first substrate 10. The second surface 200 further forms two third via holes 25 through the second substrate 20, which correspond to the receiving hole 11 of the first substrate 10.

Electrically conductive adhesive or metal such as gold, silver, copper, or etc., is filled in the second and the third via holes 22, 25. The electrically conductive adhesive in the second via holes 22 is used to connect with the electrically conductive adhesive in the first via holes 12 so as to electrically connect the LED chip with the external power source. The electrically conductive adhesive in the third via holes 25 is used for electrically connecting the electric component with an external power source (not shown). Thermal conductive adhesive or metal such as gold, silver, copper, or etc., is filled in the second thermo-via holes 23 so as to dissipate the heat generated by the LED chip towards outside of the LED.

Figure 4:
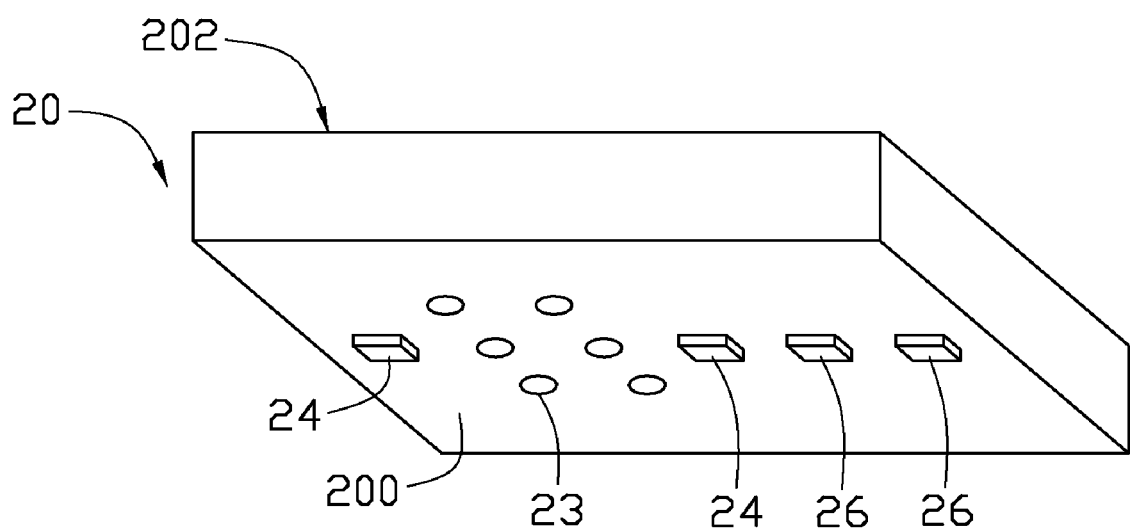
FIG. 4 shows a step in manufacturing the substrate of the LED, in which step electrodes are formed on the second substrate of FIG. 3.
Figure 5:
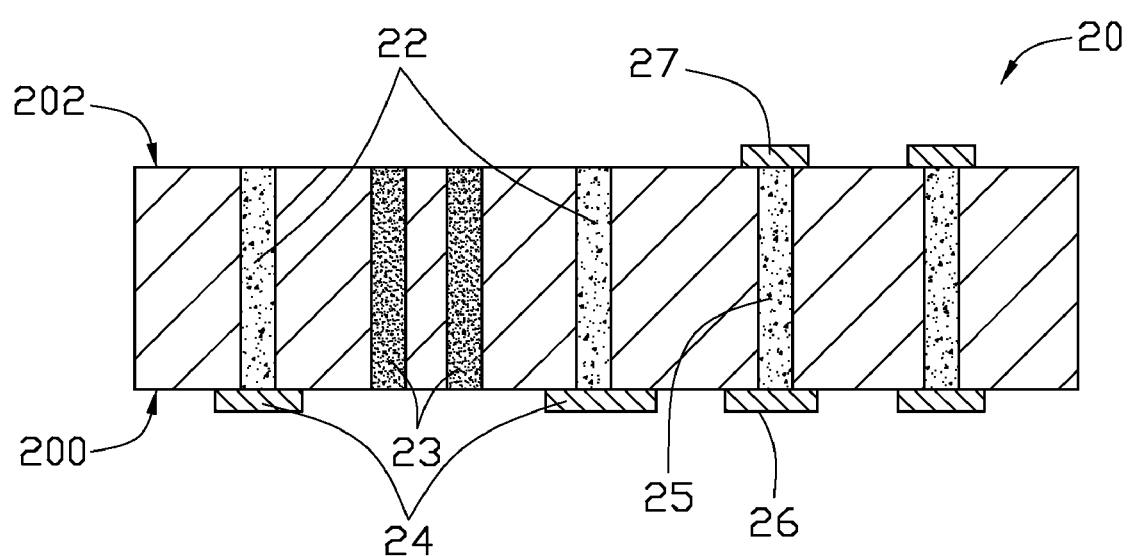
FIG. 5 is a cross-sectional view of FIG. 4.

Referring to FIGS. 4 and 5, the second substrate 20 further includes a third surface 202 opposite to the second surface 200. The electric component is arranged on the third surface 202. Two second electrodes 24 and two third electrodes 26 are printed on the second surface 200 of the second substrate 20, whilst two fourth electrodes 27 are printed on the third surface 202 of the second substrate 20, both respectively providing power to the LED chip and the electric component. The second electrodes 24 entirely cover a bottommost end the second via holes 22 and correspond to the first electrodes 14 formed on the first surface 100 of the first substrate 10. The second electrodes 24 electrically connect with corresponding first electrodes 14, respectively, forming two pairs of electrodes which respectively function as the positive and negative electrodes for the LED chip. The third and the fourth electrodes 26, 27 respectively and entirely cover top and bottom ends of the third via holes 25. The third electrodes 26 electrically connect with corresponding fourth electrodes 27, respectively, forming two pairs of electrodes which respectively function as the positive and negative electrodes for the electric component.

When the electric component is the integrated circuit for electrostatic protection or the electrostatic prevention element, the electric component needs to electrically and parallel connect with the LED chip. Accordingly, in order for the electric component to electrically and parallel connects with the LED chip, the second electrodes 24 are required to connect with the third electrodes 26, respectively. When the electric component is the light intensity sensor or the thermal sensor, the electric component needs to electrically insulate from the LED chip. Under this condition, the second and the third electrodes 24, 26 are required to be isolated from each other.

Figure 7:
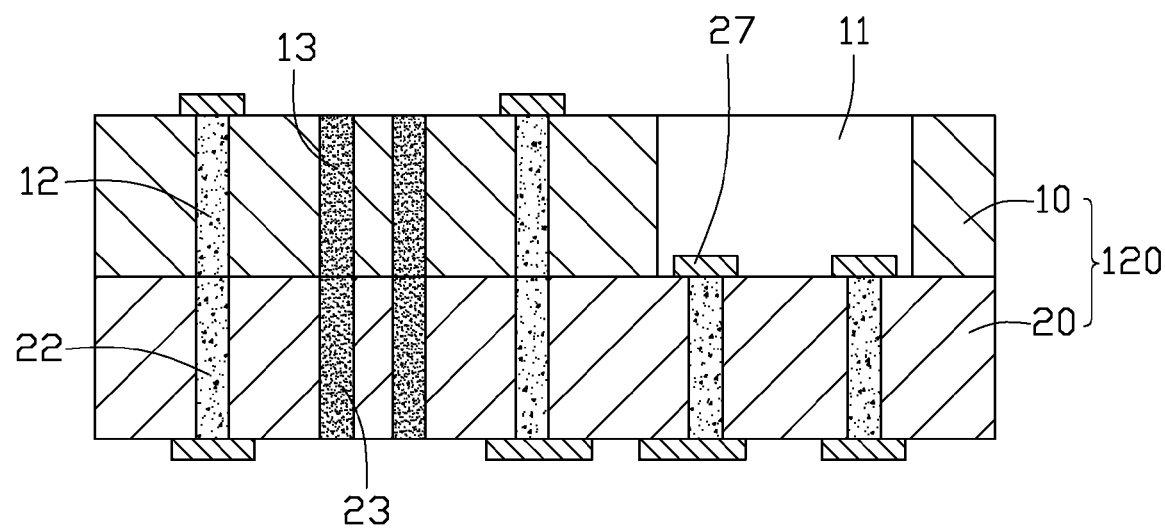
FIG. 7 is a cross-sectional view of FIG. 6.

Referring to FIGS. 6 and 7, in the process of stacking the first and the second substrates 10, 20 together, the second substrate 20 is located downside the first substrate 10. Meanwhile, the first via holes 12 of the first substrate 10 align with the second via holes 22 of the second substrate 20, and the first thermo-via holes 13 of the first substrate 10 aligns with the second thermo-via holes 23 of the second substrate 20. The fourth electrodes 27 formed on the third surface 202 of the second substrate 20 are accommodated in the receiving hole 11 of the first substrate 10.

Referring to FIG. 7, after the step of co-sintering the first and the second substrates 10, 20, the first and the second substrates 10, 20 are co-fired together at a temperature from 800 to 1100 centigrade and form a single piece, i.e., the laminated substrate structure 120 of the LED. The electrically conductive material filled in the first via holes 12 electrically connects with the electrically conductive material in the second via holes 22. The thermal conductive material filled in the first thermo-via holes 13 thermally connects with the thermal conductive material in the second thermo-via holes 23. Accordingly, the first electrodes 14 electrically connect to the corresponding second electrodes 24 by the electrically conductive materials filled in the first and the second via holes 12, 22.

Figure 8:
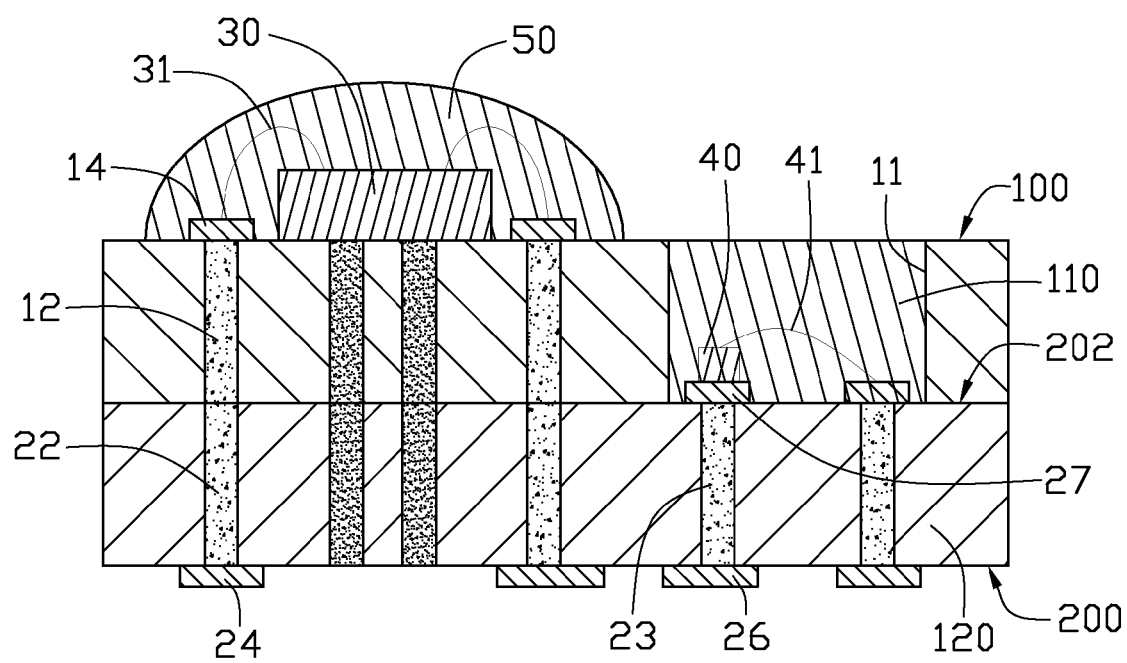
FIG. 8 is a cross sectional view of a first embodiment of the LED.

Referring to FIG. 8, a first embodiment of the LED (light emitting diode) using the laminated substrate structure 120 is shown. In the present LED 80, the LED chip 30 is enveloped in a transparent capsulation material 50 which extends to a range enclosing the first via holes 12 therein but exposing the receiving hole 11 outside. The transparent capsulation material 50 is made of epoxy resin, or silicone resin. The LED chip 30 is secured above the first thermo-via holes 13 and thermally connected with surrounding environments by the thermal conductive materials filled in the first and the second thermo-via holes 13, 23. A distance between a central line of the receiving hole 11 and a central line of the LED chip 30 is about half of a latitudinal length of the laminated substrate structure 120. An electrostatic prevention element 40 is enveloped in the receiving hole 11 by transparent protecting adhesive 110 filled in the receiving hole 11. The transparent protecting adhesive 110 is preferred to be selected from materials which have a similar refractive index to the material of the transparent capsulation material 50. The transparent protecting adhesive 110 preferably has the same material as the transparent capsulation material 50. Alternatively, the transparent protecting adhesive 110 can be omitted, which induces the electrostatic prevention element 40 to be exposed outside to the surrounding environment. The LED chip 30 is electrically connected with the first electrodes 14 by two gold wires 31 enveloped in the transparent capsulation material 50, and further electrically connected to the second electrodes 24 by the electrically conductive materials filled in the first and the second via holes 12, 22. The electrostatic prevention element 40 is disposed on and electrically connected with one of the fourth electrodes 27. The electrostatic prevention element 40 electrically connects with the other one of the fourth electrodes 27 by a third gold wire 41. The electrostatic prevention element 40 is further electrically connected with the third electrodes 26 by the fourth electrodes 27 and the electrically conductive materials filled in the third via holes 25. The electrostatic prevention element 40 and the LED chip 30 are electrically connected in parallel with each other by electrically connecting the second electrodes 24 with the corresponding third electrodes 26, respectively. Due to the electrostatic prevention element 40 being accommodated in the receiving hole 11 and below the first surface 100 of the first substrate 10, it cannot absorb the light emitted from the LED chip 30 which is secured on the first surface 100. Therefore, the present LED 80 has good electrostatic prevention capability but does not decrease its luminous efficiency.

Figure 9:
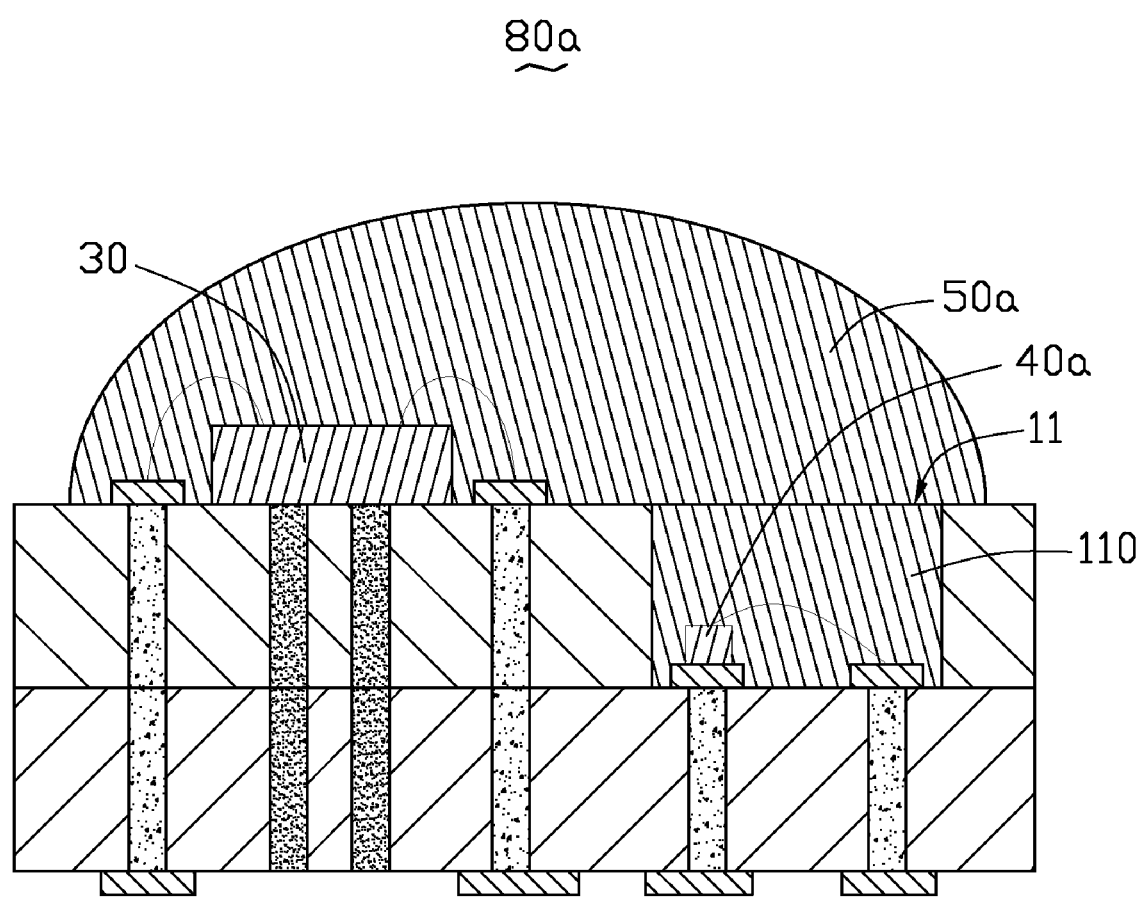
FIG. 9 is a cross sectional view of a second embodiment of the LED.

Referring to FIG. 9, a second embodiment of the present LED 80a is shown. In the second embodiment of the LED 80a, the electric component is a light intensity sensor 40a which is received in the receiving hole 11 and electrically isolates from the LED chip 30. The transparent capsulation material 50a extends to a range enclosing the first via holes 12, the LED chip 30 and a topmost end of the transparent protecting adhesive 110 therein, and communicates with the transparent protecting adhesive 110 filled in the receiving hole 11. Thus, the light emitted from the LED chip 30 can easily be sensed and detected by the light intensity sensor 40a. Moreover, the transparent protecting adhesive 110 is preferred to be selected from materials, which have similar refractive index to the material of the transparent capsulation material 50a. The transparent protecting adhesive 110 is preferably to have the same material with the transparent capsulation material 50a. Therefore, the transparent protecting adhesive 110 is integrally formed with the transparent capsulation material 50a to form a single transparent capsulation material member which encloses the LED chip 30 and the light intensity sensor 40a therein. This reduces energy loss of the light during the light transmitting from the LED chip 30 towards the light intensity sensor 40a. Therefore, the light intensity sensor 40a can obtain a more actually result.

In the present manufacturing method, the laminated substrate structure 120 is obtained by co-sintering the first and the second substrates 10, 20. The receiving hole 11 of the first substrate 10 receives the electric component therein so that the electric component can extend the reliability and/or practicability of the LED 80, 80a without decreasing the luminous efficiency of the LED 80, 80a. In addition, the receiving hole 11 is formed on the laminated substrate structure 120 by firstly forming the receiving hole 11 through the first substrate 10 and then co-sintering the first and the second substrates 10, 20 together. Therefore, a depth of the receiving hole 11 is determined by a thickness of the first substrate 10. There is no need to control the depth of the receiving hole 11 as comparing to a method which firstly forming a blind receiving hole in a substrate and then forming two through via holes which communicates with the blind receiving hole of the substrate. Therefore, the manufacturing of the laminated substrate structure 120 is simplified.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A solid state light emitting device comprising:
    a laminated substrate structure which comprises a first substrate and a second substrate attached to each other, the first substrate having a mounting surface and a receiving through hole defined in the mounting surface thereof;
    an LED chip mounted on the mounting surface of the first substrate;
    a transparent capsulation material enveloping the LED chip therein; and
    an electric component received in the receiving through hole and mounted on the second substrate, the entire electric component being located below the mounting surface of the first substrate.

2. The solid state light emitting diode of claim 1, wherein the first and second substrates are made of ceramic material.

3. The solid state light emitting diode of claim 1, wherein the electric component is selected from a group consisting of an integrated circuit for electrostatic protection, an electrostatic prevention element, a light intensity sensor, and a thermal sensor.

4. The solid state light emitting diode of claim 1, further comprising a protecting adhesive filled in the receiving through hole, the protecting adhesive configured for enveloping the electric component in the receiving through hole.

5. The solid state light emitting diode of claim 4, wherein the transparent capsulation material extends to a range enclosing the LED chip and a topmost end of the protecting adhesive therein.

6. The solid state light emitting diode of claim 1, wherein the laminated substrate structure defines a plurality of via holes through the first and second substrates, electrically conductive materials being filled in the via holes, for electrically connecting the LED chip and the electric component to an external power source.

7. The solid state light emitting diode of claim 6, wherein the transparent capsulation material extends to a range enclosing all the via holes of the first substrate but exposing the receiving through hole outside.

8. The solid state light emitting diode of claim 7, further comprising a plurality of electrodes disposed on the second substrate in the receiving through hole, each electrode covering a respective opening of a corresponding plurality of the via holes of the second substrate and being electrically attached to the electrically conductive materials filled therein, and the electric component being positioned on one of the electrodes.

9. A solid state light emitting device comprising:
    a laminated substrate structure which comprises a first substrate attached on a second substrate, the first substrate having a top mounting surface and a receiving through hole spanning from the mounting surface to the second substrate;
    a light emitting diode chip mounted on the top mounting surface of the first substrate;
    an electric component completely received in the receiving through hole and mounted above the second substrate; and
    a transparent capsulation material attached on the top mounting surface with at least the LED chip embedded in the transparent capsulation material;
    wherein the laminated substrate structure defines a plurality of first via holes through the first substrate and a plurality of second via holes through the second substrate, electrically conductive materials being filled in the first and second via holes such that the LED chip and the electric component can be electrically connected to an external power source.

10. The solid state light emitting diode of claim 9, further comprising a plurality of electrodes disposed on a surface of the second substrate which bounds the receiving through hole of the first substrate, each electrode covering a respective opening of a corresponding plurality of the second via holes and being electrically attached to the electrically conductive materials filled in the corresponding plurality of the second via holes, the electric component being mounted on one of the electrodes.

11. The solid state light emitting diode of claim 9, wherein the light emitting diode chip is spaced from the receiving through hole.

12. The solid state light emitting diode of claim 9, wherein a height of the electric component above the second substrate is less than half a height of the receiving through hole.

13. The solid state light emitting diode of claim 9, wherein the second substrate underlies an entirety of the first substrate.

14. A solid state light emitting device comprising:
a laminated substrate structure which comprises a first substrate and a second substrate attached to each other, the first substrate having a mounting surface and a receiving through hole, a top extremity of the receiving through hole located at the mounting surface;
an LED chip mounted on the mounting surface of the first substrate;
a transparent capsulation material enveloping the LED chip therein; and
an electric component received in the receiving through hole and mounted on the second substrate, the entire electric component being located below the mounting surface of the first substrate.

15. The solid state light emitting diode of claim 14, further comprising a protecting adhesive filled in the receiving through hole, the protecting adhesive configured for enveloping the electric component in the receiving through hole.

16. The solid state light emitting diode of claim 14, wherein the laminated substrate structure defines a plurality of via holes through the first and second substrates, electrically conductive materials being filled in the via holes, for electrically connecting the LED chip and the electric component to an external power source.

\* \* \* \* \*